(12) United States Patent
Karda et al.

(10) Patent No.: US 9,276,134 B2
(45) Date of Patent: *Mar. 1, 2016

(54) FIELD EFFECT TRANSISTOR CONSTRUCTIONS AND MEMORY ARRAYS

(71) Applicant: Micron Technology, Inc., Boise, ID (US)

(72) Inventors: Kamal M. Karda, Boise, ID (US); Chandra Mouli, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/519,021

(22) Filed: Oct. 20, 2014

(65) Prior Publication Data
US 2015/0200308 A1    Jul. 16, 2015

Related U.S. Application Data

(63) Continuation-in-part of application No. 14/152,664, filed on Jan. 10, 2014, now Pat. No. 9,076,686.

(51) Int. Cl.
*H01L 27/11* (2006.01)
*H01L 29/792* (2006.01)
(Continued)

(52) U.S. Cl.
CPC ...... *H01L 29/7926* (2013.01); *H01L 27/11582* (2013.01); *H01L 29/0603* (2013.01); *H01L 29/24* (2013.01); *H01L 29/66484* (2013.01);
(Continued)

(58) Field of Classification Search
CPC ............... H01L 27/11; H01L 27/1104; H01L 27/11563; H01L 27/11565; H01L 27/11568; H01L 27/1203; H01L 27/14609; H01L 27/14689; H01L 27/14806
See application file for complete search history.

(56) References Cited

U.S. PATENT DOCUMENTS 6,370,056 B1    4/2002    Chen et al.
6,674,109 B1    1/2004    Fujimori et al.
(Continued)

FOREIGN PATENT DOCUMENTS

JP    2009-170511    7/2009
WO    WO 2008-073529    6/2008
(Continued)

OTHER PUBLICATIONS

U.S. Appl. No. 13/964,309, filed Aug. 12, 2013, Karda et al.
(Continued)

*Primary Examiner* — Kyoung Lee
(74) *Attorney, Agent, or Firm* — Wells St. John P.S.

(57) ABSTRACT

In some embodiments, a transistor includes a stack having a bottom source/drain region, a first insulative material, a conductive gate, a second insulative material, and a top source/drain region. The stack has a vertical sidewall with a bottom portion along the bottom source/drain region, a middle portion along the conductive gate, and a top portion along the top source/drain region. Third insulative material is along the middle portion of the vertical sidewall. A channel region material is along the third insulative material. The channel region material is directly against the top and bottom portions of the vertical sidewall. The channel region material has a thickness within a range of from greater than about 3 Å to less than or equal to about 10 Å; and/or has a thickness of from 1 monolayer to 7 monolayers.

33 Claims, 11 Drawing Sheets

(51) Int. Cl.

| | |
|---|---|
| *H01L 29/66* | (2006.01) |
| *H01L 27/115* | (2006.01) |
| *H01L 29/06* | (2006.01) |
| *H01L 29/24* | (2006.01) |
| *H01L 21/02* | (2006.01) |

(52) U.S. Cl.
CPC .... H01L 29/66666 (2013.01); H01L 29/66833 (2013.01); *H01L 21/02568* (2013.01)

(56) References Cited

U.S. PATENT DOCUMENTS

| | | | |
|---|---|---|---|
| 6,717,215 | B2 | 4/2004 | Fricke et al. |
| 7,180,141 | B2 | 2/2007 | Eliason et al. |
| 7,525,830 | B2 | 4/2009 | Kang |
| 7,902,594 | B2 | 3/2011 | Ono |
| 8,021,897 | B2 | 9/2011 | Sills et al. |
| 9,076,686 | B1 * | 7/2015 | Karda et al. |
| 2002/0125536 | A1 | 9/2002 | Iwasa et al. |
| 2005/0282296 | A1 | 12/2005 | Hsu et al. |
| 2006/0118841 | A1 | 6/2006 | Eliason et al. |
| 2010/0140589 | A1 | 6/2010 | Ionescu |
| 2011/0248324 | A1 | 10/2011 | Kang |
| 2012/0248398 | A1 | 10/2012 | Liu |
| 2012/0280291 | A1 | 11/2012 | Lee et al. |
| 2012/0319185 | A1 | 12/2012 | Liang et al. |
| 2013/0043455 | A1 | 2/2013 | Bateman |
| 2013/0056698 | A1 | 3/2013 | Satoh et al. |
| 2013/0126816 | A1 | 5/2013 | Tang et al. |

FOREIGN PATENT DOCUMENTS

| | | |
|---|---|---|
| WO | PCT/US2014/047570 | 11/2014 |
| WO | PCT/US2015/025894 | 7/2015 |

OTHER PUBLICATIONS

U.S. Appl. No. 14/152,664, filed Jan. 10, 2014, Karda.
Breakdown of High-Performance Monolayer MoS2 Transistors; Lembke et al.; www.acsnano.org; Oct. 2012; pp. A-F.
Das et al.; High Performance Multilayer MoS2 Transistors with Scandium Contacts; NANO Letters; ACS Publications; Dec. 14, 2012; pp. 100-105.
Ferroelectric Nonvolatile Nanowire Memory Circuit Using a Single ZnO Nanowire and Copolymer Top Layer; Tack Lee et al.; Advanced Materials 2012, 24, pp. 3020-3025.
Ferroelectric RAM; http://en.wikipedia.org/wiki/Ferroelectric_RAM; Last Modified Feb. 25, 2013; 6 pp.
Large Area Vapor Phase Growth and Characterization of MoS2 Atomic Layers on SiO2 Substrate; Zhan et al.; Dept. of Mechanical Engineering & Materials Science; Rice University; Feb. 15, 2012; 24 pp.
Liu et al.; Growth of Large-Area and Highly Crystailine MoS2 Thin Layers on Insulating Substrates; NANO Letters; ACS Publications; Feb. 27, 2012; pp. 1538-1544.
Min et al.; Nanosheet thickness-modulated MoS2 dielectric property evidenced by field-effect transistor performance; The Royal Society of Chemistry; Dec. 3, 2012; 2 pp.
MoS 2 Nanosheets for Top-Gate Nonvolatile Memory Transistor Channel; Sung Lee et al.; Small 2012,8,No. 20, pp. 3111-3115.
R.S. Lous; Ferroelectric Memory Devices, How to store information of the future; Top Master Programme in Nanoscience; Jul. 2011; 23 pp.
Single-layer MoS2 transistors; Radisavijevic et al.; Nature Nanotechnology; vol. 6; Mar. 2011; pp. 147-150.
W. Liu et al.; Role of Metal Contacts in Designing High-Performance Monolayer n-Type WSe2 Effect Transistors; NANO Letters; ACS Publications; Mar. 25, 2013; pp. 1983-1990.
Zhang et al.; Ambipolar MoS2 thin Flake Transistors; NANO Letters; ACS Publications; Jan. 25, 2012; pp. 1136-1140.
U.S. Appl. No. 14/305,459, filed Jun. 16, 2014, Ramswamy et al.
U.S. Appl. No. 14/508,912, filed Oct. 7, 2014, Ramaswamy.
Pandey et al., "Structural, ferroelectric and optical properties of PZT thin films", 2005, PHYSICA B, vol. 368, Nov. 2005; pp. 135-142.
Robertson, "Band offsets of wide-band-gap oxides and implications for future electronic devices"; J. Vac. Sci. Technol., B 18(3); May 2000; pp. 1785-1791.

* cited by examiner

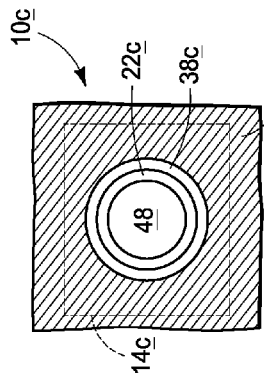
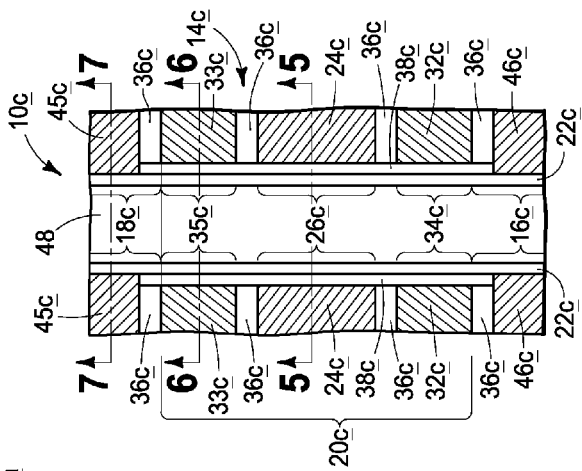
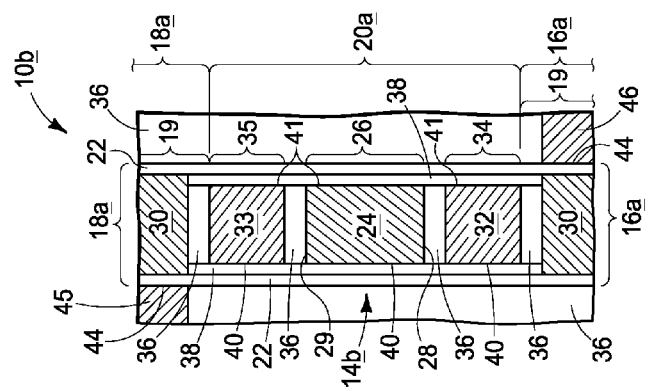
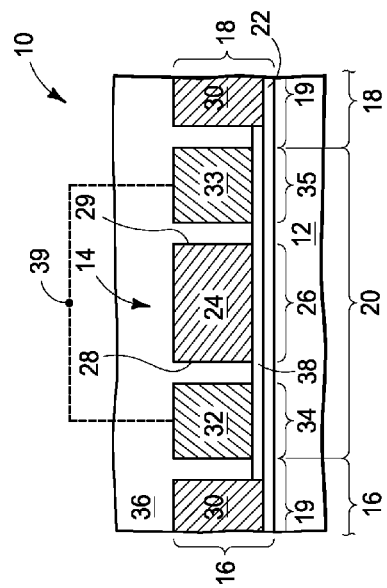
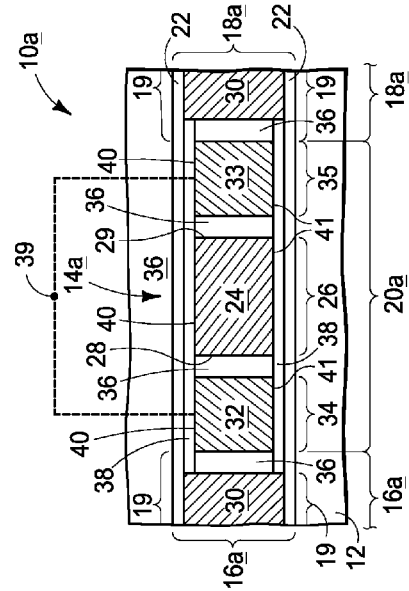

9,276,134 B2

FIELD EFFECT TRANSISTOR CONSTRUCTIONS AND MEMORY ARRAYS

RELATED PATENT DATA

This application is a continuation-in-part of U.S. application Ser. No. 14/152,664, which was filed Jan. 10, 2014, and which issued as U.S. Pat. No. 9,076,686.

TECHNICAL FIELD

Embodiments disclosed herein pertain to field effect transistor constructions and to memory arrays having a plurality of field effect transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate dielectric. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Ideally, length of the channel region is made as short as possible to maximize operating speed of the transistor in the "on" state and to maximize circuit density. However, short physical channel length is not good in the "off" state as leakage current ($I_{off}$) between the source/drain regions is higher for short channel devices than for long channel devices. It is also desired to develop vertically-oriented field effect transistors which may be scaled to increasingly smaller footprints with increasing levels of integration.

BRIEF DESCRIPTION OF THE DRAWINGS

FIG. 1 is a diagrammatic sectional view of a substrate fragment comprising a field effect transistor in accordance with an embodiment of the invention.

FIG. 2 is a diagrammatic sectional view of a substrate fragment comprising a field effect transistor in accordance with an embodiment of the invention.

FIG. 3 is a diagrammatic sectional view of a substrate fragment comprising a field effect transistor in accordance with an embodiment of the invention.

FIG. 4 is a diagrammatic sectional view of a substrate fragment comprising a field effect transistor in accordance with an embodiment of the invention.

FIG. 5 is a sectional view taken through line 5-5 in FIG. 4.

DETAILED DESCRIPTION OF EXAMPLE EMBODIMENTS

Figure 8:
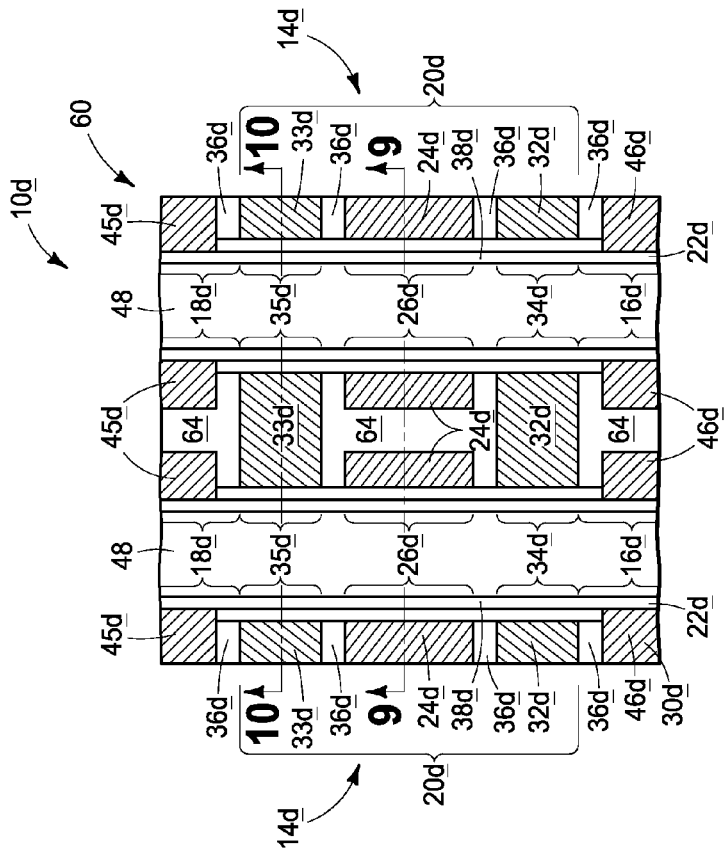
FIG. 8 is a diagrammatic sectional view of a substrate fragment comprising a portion of memory array in accordance with an embodiment of the invention.
Figure 6:
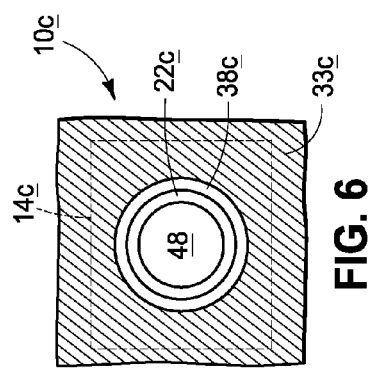
FIG. 6 is a sectional view taken through line 6-6 in FIG. 4.
Figure 7:
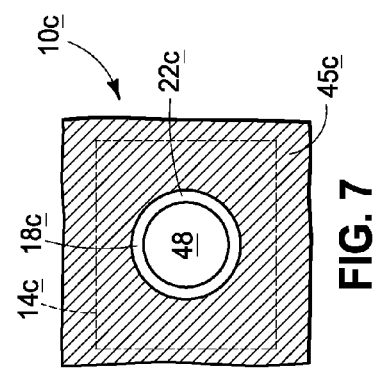
FIG. 7 is a sectional view taken through line 7-7 in FIG. 4.

An example field effect transistor construction in accordance with an embodiment of the invention is described initially with reference to FIG. 1. An example substrate fragment 10 comprises dielectric material (i.e. insulative material) 12 having various materials formed there-over which comprise a field effect transistor construction 14. Example dielectric materials 12 are doped silicon dioxide, undoped silicon dioxide, and silicon nitride. Other partially or wholly fabricated components of integrated circuitry may be formed as part of, or be elevationally inward of, material 12. Substrate fragment 10 may comprise a semiconductor substrate. In the context of this document, the term "semiconductor substrate" or "semi-conductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In some embodiments, material 12 may be utilized as an example of a "substrate" or a "base".

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Transistor construction 14 comprises two source/drain regions 16, 18 and a channel region 20 there-between. Channel region 20 comprises a channel material 22 (which may also be referred to as a channel region material) having a thickness of 1 monolayer to 7 monolayers and has a physical length between source/drain regions 16 and 18 (e.g., the length shown as the bracketed expanse 20). In this document, "thickness" is defined as the mean straight-line distance through a given material perpendicularly from a closest surface of immediately adjacent material of different composition. Channel material 22 may comprise any suitable composition or combination of compositions. In some embodiments, channel material 22 may comprise, consist essentially of, or consist of transition metal chalcogenide; and accordingly may be referred to as transition metal chalcogenide material. The transition metal chalcogenide may, for example, comprise, consist essentially of, or consist of transition metal dichalcogenide (for instance, $MoS_2$, $WS_2$, $InS_2$, $InSe_2$, $MoSe_2$, $WSe_2$, etc.) and/or transition metal trichalcogenide (for instance, $MoS_3$, $WS_3$, $InS_3$, $InSe_3$, $MoSe_3$, $WSe_3$, etc.). In one embodiment, transition metal chalcogenide material 22 is no greater than 4 monolayers in thickness, and in one embodiment is no greater than 2 monolayers in thickness.

In one embodiment and as shown, source/drain regions 16 and 18 also comprise transition metal chalcogenide material 22 having a thickness of 1 monolayer to 7 monolayers (e.g., an extension portion 19 of material 22). Source/drain regions 16 and 18 are shown as comprising conductive (i.e., electrically) material 30 that is directly against chalcogenide material 22. Conductive material 30 may be any one or more of conductively-doped semiconductive material, one or multiple elemental metal(s), an alloy of elemental metals, and a conductive metal compound. Conductive material 30 may alternately extend to dielectric material 12 in the absence of transition metal chalcogenide material 22 being between materials 12 and 30. Further when chalcogenide material 22 is between materials 12 and 30, the respective source/drain regions may be considered as constituting material 22 that is directly against material 30, with material 30 being considered as a conductive contact to material 22 as opposed to necessarily per se being considered as part of two source/drain regions of transistor construction 14.

In one embodiment, channel region 20 is devoid of conductivity enhancing impurity and in one embodiment is devoid of detectable conductivity enhancing impurity. In this document, "devoid of conductivity enhancing impurity" means no more than $1 \times 10^{14}$ atoms/cm$^3$. In one embodiment, source/drain regions 16 and 18 are devoid of conductivity enhancing impurity and in one embodiment are devoid of detectable conductivity enhancing impurity. In one embodiment where transition metal chalcogenide material 22 comprises at least part of the respective source/drain regions, such material 22 is devoid of conductivity enhancing impurity and in one embodiment is devoid of detectable conductivity enhancing impurity.

Transistor construction 14 comprises a mid-gate 24 operatively proximate a mid-portion 26 of channel region 20 relative to the physical length thereof. In one embodiment and as shown, mid-portion 26 is centered relative to channel region 20. Mid-gate 24 may be considered as having opposite sides 28 and 29. A pair of gates 32 and 33 is operatively proximate different portions 34 and 35, respectively, of channel region 20, with portions 34 and 35 each being different from portion 26. Gate 32 is spaced and electrically isolated from mid-gate 24 on side 28, and gate 33 is spaced and electrically isolated from mid-gate 24 on side 29 in the depicted example. Such electrical isolation is shown occurring by dielectric material 36 that is laterally between immediately adjacent of conductive components 30, 32, 24, 33, and 30. Example dielectric materials 36 are the same as for material 12. An example lateral thickness for dielectric material 36 between the conductive material of structures 30, 32, 24, and 33 is from about 1 nanometer to 15 nanometers. Additionally, gate dielectric 38 is between channel region 20 and each of mid-gate 24, gate 32, and gate 33. An example thickness for gate dielectric 38 is from about 1 nanometer to 30 nanometers.

In one embodiment, gates 32 and 33 are electrically coupled together, for example as is shown schematically via an interconnect line 39. In one embodiment, mid-gate 24 has a work function that is different from that of at least one of gates 32 and 33. Gates 32 and 33 may have the same work function relative one another or may have different work functions relative one another. In the context of this document, same work function means a difference in the work functions of zero to no more than 0.1 eV, and different work function means a difference in the work functions of at least 0.2 eV. In one embodiment, mid-gate 24, gate 32, and gate 33 have the same work function. In one embodiment, gates 32 and 33 are of the same composition. In one embodiment, mid-gate 24, gate 32, and gate 33 are all of the same composition. In one embodiment, mid-gate 24, gate 32, and gate 33 comprise conductively-doped semiconductive material that is n-type. In one such embodiment, work function of mid-gate 24 is greater than that of gates 32 and 33 (i.e., by at least 0.2 eV). In one embodiment, mid-gate 24 and gates 32 and 33 comprise conductively-doped semiconductive material that is p-type. In one such embodiment, work function of mid-gate 24 is less than that of gates 32 and 33 (i.e., by at least 0.2 eV). As some examples for materials of gates 24, 32, and 33, n+ doped polysilicon and p+ doped polysilicon (i.e., each doped to at least $1 \times 10^{20}$ atoms/cm$^3$) have work functions of about 4.0 eV and 5.1 eV, respectively. TiN has a work function of about 4.65 eV, with W and WN having work functions ranging between about 4.3 eV and 4.6 eV.

FIG. 2 shows a field effect transistor construction 14a formed with respect to a substrate fragment 10a in accordance with an alternate embodiment of the invention. Like numerals from the above-described embodiments have been used where appropriate, with some construction differences being indicated with the suffix "a". Gates 32, 24, and 33 may be considered as respectively comprising opposing sides 40 and 41, with those sides of mid-gate 24 being different from opposite mid-gate sides 28 and 29. Channel region 20a comprises transition metal chalcogenide material 22 having a thickness of 1 monolayer to 7 monolayers on each of opposing sides 40 and 41 of mid-gate 24 and pair of gates 32, 33. Gate dielectric 38 is between transition metal chalcogenide material 22 and each of opposing sides 40, 41 of mid-gate 24 and pair of gates 32, 33. In one embodiment and as shown, source/drain regions 16a and 18a individually comprise two spaced portions 19 of transition metal chalcogenide material 22. Conductive material 30 is between and electrically couples portions 19 within both source/drain regions 16a, 18a. Again, material 30 may be considered as part of source/drain regions 16a, 18a perhaps dependent upon its composition, or as a conductive interconnect between source/drain regions that are considered as portions 19 of chalcogenide material 22. As an alternate construction and analogous to that described above with respect to FIG. 1, no transition metal chalcogenide material 22 may be between material 30 and material 12 (not shown), and between material 30 and material 36 (not shown).

Field effect transistor constructions in accordance with embodiments of the invention may have any desired orientation. FIGS. 1 and 2 show constructions 14 and 14a as being horizontally oriented. In alternate embodiments, a field effect transistor construction may be vertically oriented or oriented other than vertical or horizontal. In this document, vertical is a direction generally orthogonal to horizontal, with horizontal referring to a general direction along a primary surface relative to which a substrate is processed during fabrication. Further, vertical and horizontal as used herein are generally perpendicular directions relative one another independent of orientation of the substrate in three-dimensional space. Additionally, elevational, above, and below are with reference to the vertical direction. Further in the context of this document, a vertically oriented transistor is characterized by predominant current flow through the channel region in the vertical direction. Further in the context of this document, a horizontally oriented transistor is characterized by predominant current flow through the channel in the horizontal direction.

As an example, a vertically oriented field effect transistor construction 14b is shown with respect to a substrate 10b in FIG. 3. Like numerals from the above-described embodiments have been used where appropriate, with some construction differences being indicated with the suffix "b" or with different numerals. The construction of FIG. 3 is analogous to that of FIG. 2, although a structure analogous to FIG. 1 or other structures may be used. FIG. 3 shows a vertically oriented field effect transistor construction 14b wherein gate 33 comprises an outer gate material that is spaced above and electrically isolated from material of mid-gate 24. Gate 32 comprises inner gate material that is spaced below and electrically isolated from material of mid-gate 24. Source/drain region 18a may be considered as an elevationally outer source/drain region and source/drain region 16a may be considered as an elevationally inner source/drain region. Outer source/drain region 18a and inner source/drain region 16a may be considered as comprising a respective lateral outer sidewall 44. In one embodiment, a conductive contact 45 is directly against lateral outer sidewall 44 of transition metal chalcogenide material 22 of outer source/drain region 18a. In one embodiment, a conductive contact 46 is directly against lateral outer sidewall 44 of transition metal chalcogenide material 22 of inner source/drain region 16a. Conductive contacts 45 and 46 are respectively shown as only contacting one lateral outer sidewall of transition metal chalcogenide material 22 of each source/drain region. Alternately or additionally, conductive contacts may be directly against (not shown) an other lateral outer sidewall of transition metal chalcogenide material 22 with respect to one or both source/drain regions.

An alternate embodiment vertical field effect transistor construction 14c is next described with reference to FIGS. 4-7 which show a substrate 10c. Like numerals from the above-described embodiments have been used where appropriate, with some construction differences being indicated with the suffix "c" or with different numerals. Vertical transistor construction 14c comprises an isolating core 48 (i.e., electrically isolating). Material of isolating core 48 may be dielectric, including for example any of the materials described above with respect to the composition of materials 12 and 36. The material of isolating core 48 may be semiconductive or conductive, and for example may provide an electrically isolating function for circuitry components (not shown) above and/or below vertical transistor construction 14c, for example being held at ground or some other potential.

Transition metal chalcogenide material 22c encircles isolating core 48 and has a lateral wall thickness of 1 monolayer to 7 monolayers. A gate dielectric 38c encircles transition metal chalcogenide material 22c. In one embodiment, isolating core 48, transition metal chalcogenide material 22c, and gate dielectric 38c each have a respective perimeter that is circular in horizontal cross-section.

Conductive mid-gate 24c encircles gate dielectric 38c at an elevational mid-portion of transition metal chalcogenide material 22c. Conductive outer gate material 33c encircles gate dielectric 38c at an elevational outer portion 35c of transition metal chalcogenide material 22c. Outer gate material 33c is elevationally spaced and electrically isolated from mid-gate material 24c, for example by dielectric 36c. Conductive inner gate material 32c encircles gate dielectric 38c at an elevational inner portion 34c of transition metal chalcogenide material 22c. Inner gate material 32c is elevationally spaced and electrically isolated from mid-gate material 24c, for example by dielectric 36c. A cross-section view is not shown with respect to inner gate material 32c for brevity. Such cross-section would appear identical to the FIG. 6 cross-section, but with numeral 32c instead being substituted for numeral 33c.

An elevationally outer source/drain region 18c encircles isolating core 48 and is spaced elevationally outward of and electrically isolated from outer gate material 33c. An elevationally inner source/drain region 16c encircles isolating core 48 and is spaced elevationally inward of and electrically isolated from inner gate material 32c. In one embodiment and as shown, the outer and inner source/drain regions 18c and 16c, respectively, comprise transition metal chalcogenide material 22c having a lateral wall thickness of thickness of 1 monolayer to 7 monolayers. In one embodiment, a conductive contact is directly against a lateral outer sidewall of at least one of outer source/drain region 18c and inner source/drain region 16c, with example conductive contacts 45c and 46c being shown. A cross-section view is not shown with respect to inner source/drain region 16c for brevity. Such cross-section would appear identical to the FIG. 7 cross-section, but instead with numerals 16c and 46c being substituted for numerals 18c and 45c, respectively. Any other or additional attribute described above with respect to the FIGS. 1-3 embodiments may be applied with respect to the embodiments described with reference to FIGS. 4-7.

Transistors as described above may be used as part of any existing or yet-to-be-developed integrated circuitry. Further, and as an example, a plurality of the above-described field effect transistors may be incorporated within an array, such as a memory array. With respect to description of structure herein as respects an array, a sub-array (i.e., a portion of a total array) may also be considered as an array. In one embodiment, a memory array in accordance with the invention comprises a plurality of memory cells which individually comprise a vertical field effect transistor. The individual transistors comprise an elevationally outer source/drain region, an elevationally inner source/drain region, and a channel region elevationally between the outer and inner source/drain regions. The channel region comprises a transition metal chalcogenide material having a lateral thickness of 1 monolayer to 7 monolayers and has a physical length elevationally between the source/drain regions. In one embodiment, the elevationally outer and inner source/drain regions comprise a transition metal chalcogenide material having a lateral wall thickness of 1 monolayer to 7 monolayers. Regardless, a mid-gate is laterally proximate an elevationally mid-portion of the channel region. An outer gate is above the mid-gate laterally proximate an elevational outer portion of the channel region. The outer gate is elevationally spaced and electrically isolated from the mid-gate. An inner gate is below the mid-gate laterally proximate an elevational inner portion of the channel region. The inner gate is elevationally spaced and electrically isolated from the mid-gate. Gate dielectric is laterally between a) the channel region, and b) the mid-gate, the outer gate, and the inner gate. Ideally, the transistor construction is the same throughout the memory array, but not necessarily so. By way of examples only, transistor construction 14$b$ of FIG. 3 and transistor construction 14$c$ of FIGS. 4-7 are but two example vertical field effect transistor constructions usable in a memory and/or transistor array in accordance with the invention.

Regardless, at least one of a) the outer gates are electrically coupled to one another within the array, and b) the inner gates are electrically coupled to one another within the array. In one embodiment, the outer gates are electrically coupled to one another within the array and the inner gate are electrically coupled to one another within the array. In one embodiment, all of the inner gates are electrically coupled with all of the outer gates within the array. Other or additional attributes as described above with respect to the FIGS. 1-7 embodiments may be used.

Figure 10:
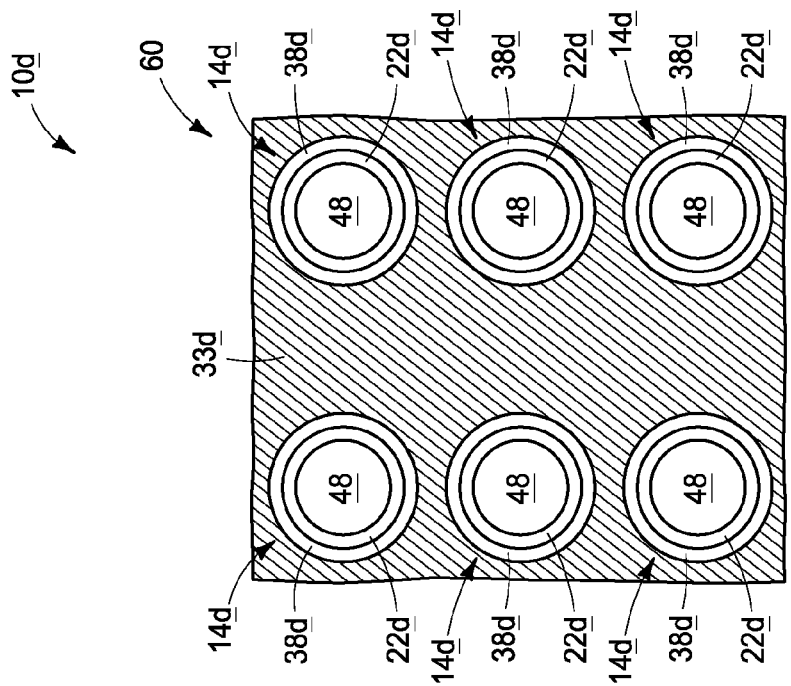
FIG. 10 is a sectional view taken through line 10-10 in FIG. 8.
Figure 9:
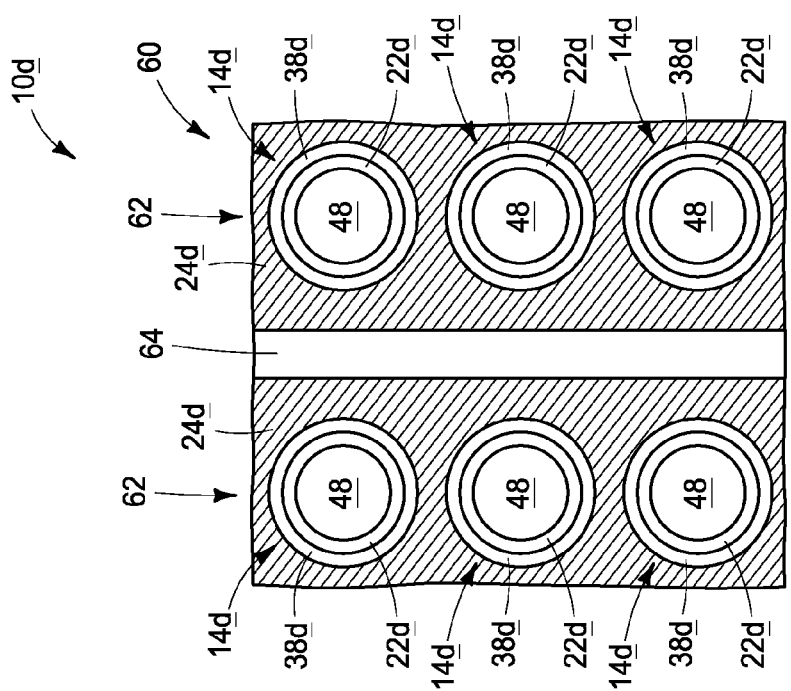
FIG. 9 is a sectional view taken through line 9-9 in FIG. 8.

A portion of one such example memory array 60 in accordance with an embodiment of the invention is shown with respect to a substrate 10$d$ in FIGS. 8-10, and comprises a plurality of field effect transistor constructions like that of FIGS. 4-7. Like numerals from the above-described embodiments have been used where appropriate, with some construction differences being indicated with the suffix "d" or with different numerals. Example array 60 has mid-gates 24$d$ interconnected (i.e., electrically coupled) among a plurality of transistors 14$d$ in rows or columns 62 that are separated from one another by suitable dielectric material 64. At least one of a) outer gates 33$d$ are electrically coupled to one another within the array, and b) inner gates 32$d$ are electrically coupled to one another within the array. Outer gates 33$d$ are shown as being electrically coupled throughout array 60, for example being plate-like. Inner gates 32$d$ are shown as being electrically coupled throughout array 60, for example being plate-like. Gates 33$d$ and 32$d$ may be electrically coupled to one another. Dielectric materials 36$d$ and 64 are shown isolating various components. Other or additional attributes as described above with respect to the FIGS. 1-7 embodiments may be used. Mid-gates 24 may be interconnected within the array in rows or columns to function as access lines. Bit lines (not shown) may interconnect one of the plurality of outer source/drains 18$d$ or the plurality of inner source/drains 18$e$ in the other of rows or columns to function as data/sense lines. Charge storage devices (not shown) (e.g., capacitors) may be electrically coupled to the other of the plurality of outer source/drains 18$d$ or the plurality of inner source/drains 18$e$.

An alternate embodiment memory array 60$e$ is shown with respect to a substrate 10$e$ in FIGS. 11-14, and comprises a plurality of field effect transistor constructions like that of FIG. 3. Like numerals from the above-described embodiments have been used where appropriate, with some construction differences being indicated with the suffix "e" or with different numerals. Example array 60$e$ has mid-gates 24$e$ interconnected among a plurality of transistors 14$e$ in rows or columns 62$e$ that are separated from one another by dielectric material 64$e$. At least one of a) outer gates 33$e$ are electrically coupled to one another within the array, and b) inner gates 32$e$ are electrically coupled to one another within the array. Outer gates 33$e$ are diagrammatically and schematically shown as being electrically coupled relative one another via an interconnect line 39 (FIG. 13), and all such outer gates 33$e$ may be electrically coupled to one another throughout the array. Inner gates 32$e$ may likewise be so-coupled, and gates 33$e$ and 32$e$ may be electrically coupled to one another throughout the array. Dielectric material 64$e$ isolates various components. Other or additional attributes as described above with respect to the embodiments of FIGS. 1-10 may be used.

Figure 12:
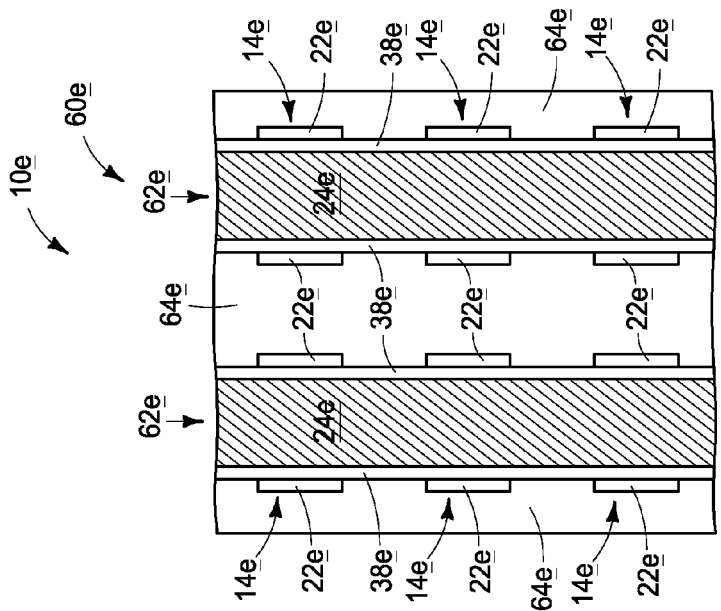
FIG. 12 is a sectional view taken through line 12-12 in FIG. 11.
Figure 11:
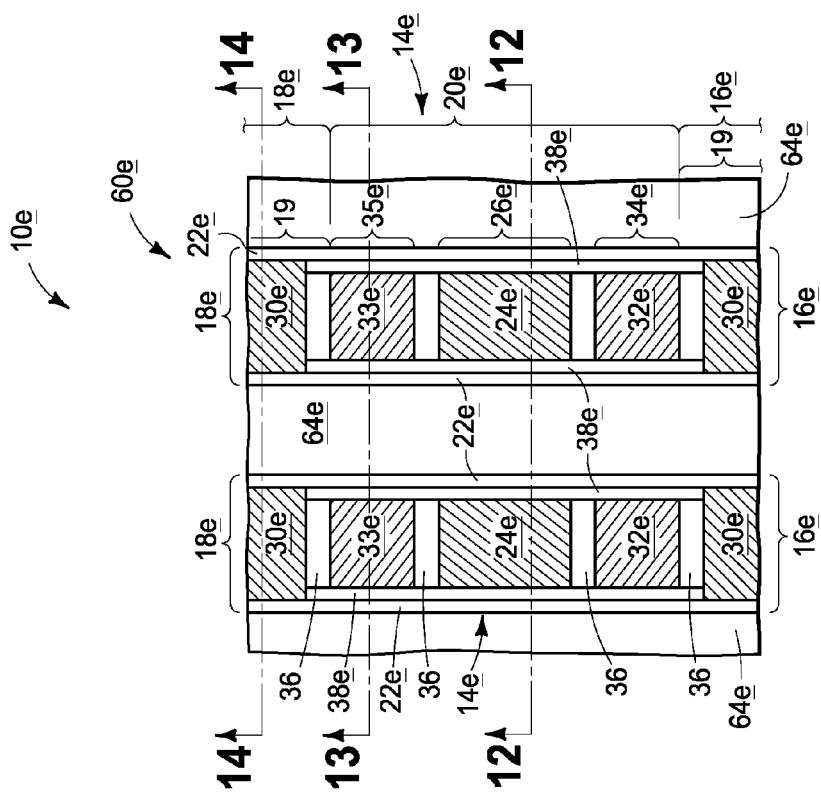
FIG. 11 is a diagrammatic sectional view of a substrate fragment comprising a portion of memory array in accordance with an embodiment of the invention.
Figure 14:
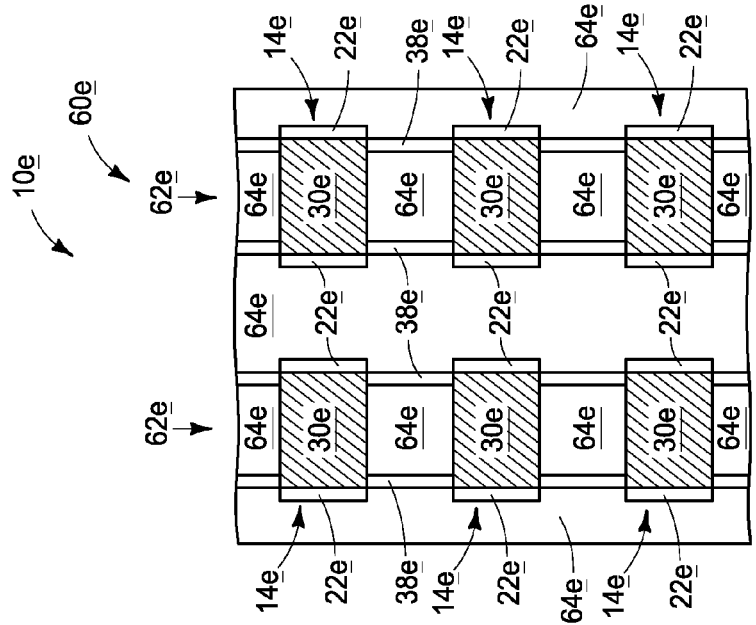
FIG. 14 is a sectional view taken through line 14-14 in FIG. 11.
Figure 13:
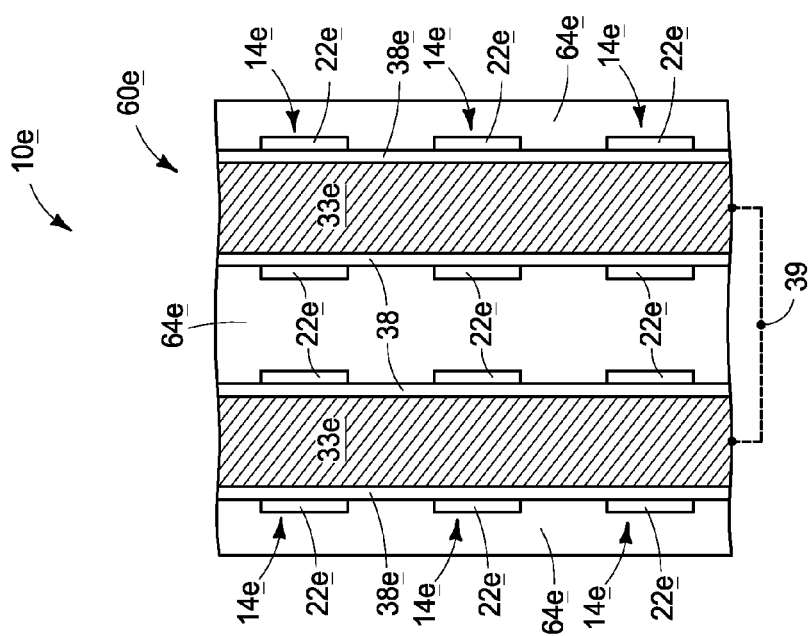
FIG. 13 is a sectional view taken through line 13-13 in FIG. 11.
Figure 15:
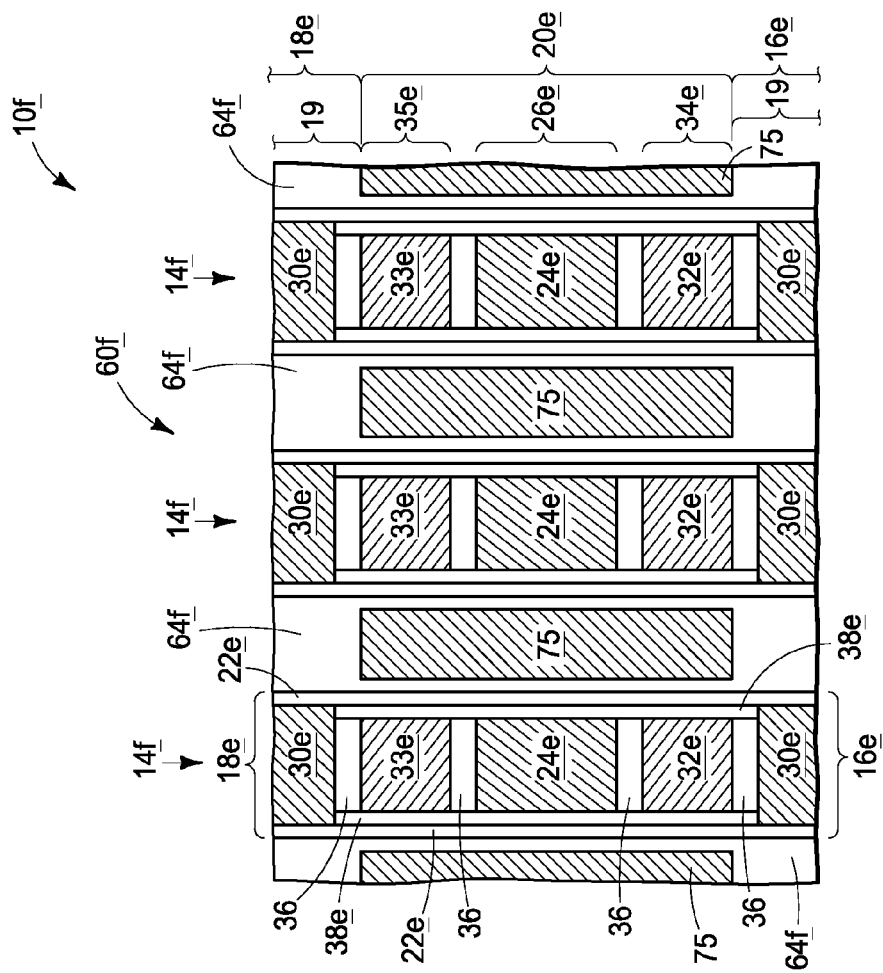
FIG. 15 is a diagrammatic sectional view of a substrate fragment comprising a portion of memory array in accordance with an embodiment of the invention.

An alternate embodiment memory array 60$f$ is shown and described with respect to a substrate 10$f$ in FIG. 15, and incorporates vertical field effect transistor constructions like that of FIG. 3 and is thereby similar to array 60$e$ of FIGS. 11-14. Like numerals from the above-described embodiments have been used where appropriate, with some construction differences being indicated with the suffix "f" or with different numerals. Transistor constructions 14$f$ are horizontally spaced from one another, with array 60$f$ comprising back bias gates 75 within dielectric material 64$f$ between immediately horizontally adjacent transistor constructions 14$f$. Back bias gates 75 may extend elevationally along elevationally outer gates, elevationally inner gates, and mid-gate 33$e$, 32$e$, and 24$e$, respectively, as shown. Individual back bias gates 75 may also extend longitudinally in lines parallel and between lines of material 24$e$ and 33$e$ as materials 24$e$ and 33$e$ are shown in FIGS. 12 and 13. In one embodiment, all back bias gates 75 within the array are electrically coupled with one another. Other or additional attributes as described above with respect to the FIGS. 1-14 embodiments may be used.

Additional circuitry (not shown) can be provided by the artisan for accessing (e.g., reading from and/or writing to) the memory cells within the array. Such circuitry may include forming a larger memory array into a plurality of separate sub-arrays. A "sub-array" as used in this paragraph to the end of this document is defined as a subset of the total memory array cells that are within a continuous area and that can be activated independent of other sub-arrays having others of the total memory array cells therein. Sub-arrays might be fabricated and operated independently, in tandem, or otherwise relative one another. Regardless, a transistor and a memory array in accordance with embodiments of the invention may be operated in any manner. Ideally, the effective channel length of a transistor in accordance with the invention may be electrostatically defined and dynamically varied. As one example with respect to a transistor and/or memory array, gates 33$d$/33$e$/33$f$ may be electrically coupled relative to one another as well as to gates 32$d$/32$e$/32$f$ in arrays 60, 60$e$, and

60f, respectively, throughout all of a given sub-array. In an "inactive", "standby", or "off" state for a sub-array, such gates may be biased so that semiconductive transition metal chalcogenide material 22 immediately there-adjacent is depleted of carriers, thereby making the effective channel length of individual transistors longer (e.g., less leakage current). In the context of this disclosure, "depleted of carriers" means less than or equal to $1 \times 10^{15}$ carriers/cm$^3$ (e.g., either electrons or holes). Mid-gates 24d/24e/24f may be provided at 0 volts or slightly negative in the inactive, standby, or off state. All "inactive" sub-arrays may have their gates so-biased, for example. Such structure and operation might reduce power consumption in the inactive, standby, or off state.

For an "active" sub-array where reading and/or writing will occur relative to memory cells in that sub-array for some period of time, gates 32, 33 may be biased to induce high carrier density in the transition metal chalcogenide material immediately there-adjacent, thereby making the effective channel length of individual transistors shorter. In the context of this document, "high carrier density" means at least $1 \times 10^{18}$ carriers/cm$^3$. The mid-gates 24d/24e/24f in the active sub-array may be operated normally in an "on" state (e.g., voltage value other than zero) to cause current flow through the effectively shorter transistor channel or in an "off" state (e.g., voltage at zero) to preclude such current flow (but for leakage). Alternate manners of operation may of course be used.

In some embodiments, it is recognized that there are advantages to fabricating vertical field effect transistors having channel material of approximately the same thickness as the conductive layer thickness in an "on" state of a transistor. Specifically, conventional transistor devices frequently use relatively thick semiconductor material across a channel region, and most of the semiconductor material is superfluous. Only a portion of the channel material adjacent the gate actually carries current in an "on" state. The superfluous channel material may be considered wasted space, and reduces scalability of the devices. In contrast, the thin channel material 22 utilized in embodiments described herein may be formed to a thickness sufficient for desirable current conduction in an "on" state, without inclusion of superfluous material. In some embodiments, the channel material may be formed to a thickness of from about 3 Å to about 10 Å; and/or may be formed to a thickness of from 1 monolayer to 7 monolayers.

FIGS. 16-20 illustrate example embodiment vertical transistor constructions 10g-k.

Figure 16:
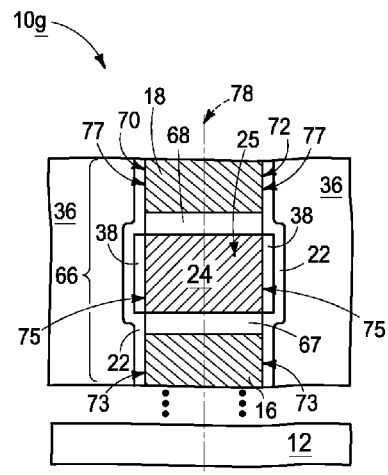
FIGS. 16-20 are diagrammatic sectional views of vertical transistor constructions in accordance with additional example embodiments.

Referring to FIG. 16, a transistor construction comprises a vertically-oriented stack 66 comprising, in ascending order, a bottom source/drain region 16, a first insulative material 67, a gate material 24 (utilized in a conductive gate 25), a second insulative material 68, and a top source/drain region 18. The insulative materials 67 and 68 may comprise the same compositions as one another, or may comprise different compositions; and in some embodiments may comprise the same compositions as described above relative to insulative material 36.

The stack 66 is supported by a base corresponding to insulative material 12. In the shown embodiments, the stack is separated from the base by a gap to indicate that there may be one or more intervening materials between the stack and the base.

The stack has vertical sidewalls 70 and 72 which are in opposing relation to one another. The vertical sidewalls have bottom portions 73 along the bottom source/drain region 16, middle portions 75 along the conductive gate 25, and top portions 77 along the top source/drain region 18.

Figure 18:
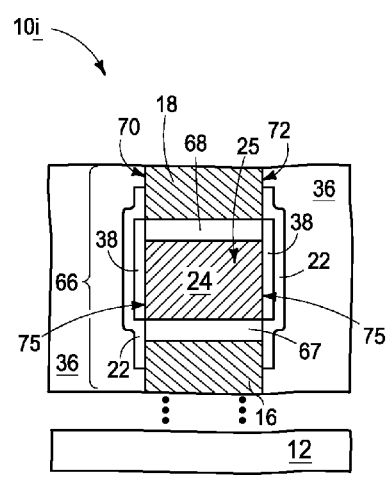
Figure 19:
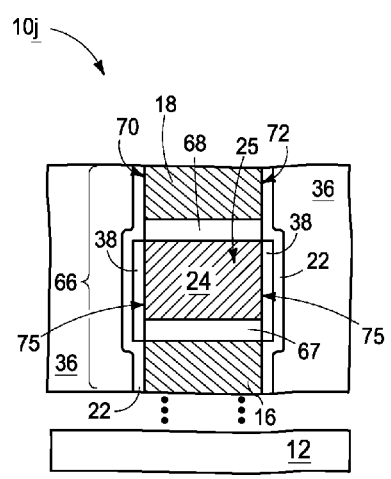
Figure 20:
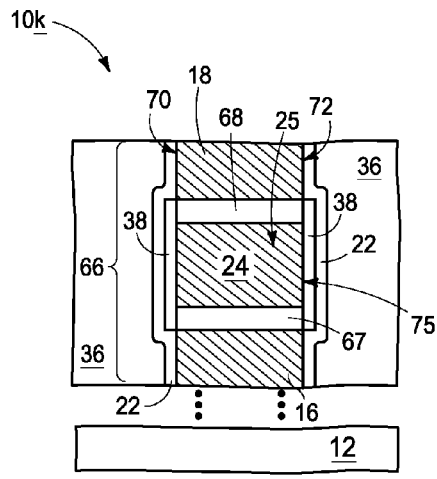

Gate dielectric 38 (which may be referred to as insulative material, and in some embodiments may be referred to as third insulative material to distinguish it from the first and second insulative materials 67 and 68) is along an entirety of the middle portion 75 of the vertical sidewalls 70/72. The gate dielectric 38 may also vertically overlap one or both of the insulative regions 67 and 68, as illustrated in FIGS. 18-20.

Channel region material 22 is along the gate dielectric 38 and spaced from the conductive gate 25 by the gate dielectric 38. The channel region material is directly against at least part of the bottom portion 73 of sidewalls 70/72, and is also directly against at least part of the top portion 77 of sidewalls 70/72. An advantage of the vertical transistor constructions described herein may be that large surfaces of the source/drain regions 16 and 18 may be directly coupled to channel region material 22 even as the constructions are scaled to smaller sizes. Specifically, the channel region 22 vertically overlaps sidewalls of the source/drain regions, and is directly against such sidewalls. Accordingly, even if the devices described herein (for instance, the transistor devices shown in FIGS. 16-20) are shrunk by compressing them along the illustrated cross-sectional width, the electrical coupling between the channel region 22 and the source/drain regions is unaffected since the areas of vertical overlap between the channel region and the source/drain regions may remain the same. The channel material may be any suitable material, including, for example, transition metal chalcogenide, crystalline semiconductor materials (e.g., monocrystalline silicon, polycrystalline silicon, etc.), or any material that may be formed in a substantially 2-dimensional orientation (i.e., in an orientation having length and width, but very little thickness).

The amount of overlap of the channel region material 22 with the source/drain regions may be varied in different embodiments, but at least some of the channel region material will vertically overlap each of the source/drain regions and directly contact each of the source/drain regions. For instance, FIG. 18 shows an embodiment in which the channel region material 22 only partially vertically overlaps the source/drain regions 16 and 18.

The channel region material 22 may comprise any of the compositions described above (for example, may comprise, consist essentially of, or consist of transition metal chalcogenide comprising one or more materials selected from the group consisting of molybdenum sulfide, molybdenum selenide, tungsten sulfide, tungsten selenide, indium sulfide and indium selenide), and may have a thickness within a range of from greater than about 3 Å to less than or equal to about 10 Å; and/or may have a thickness of from 1 monolayer to 7 monolayers.

Figure 17:
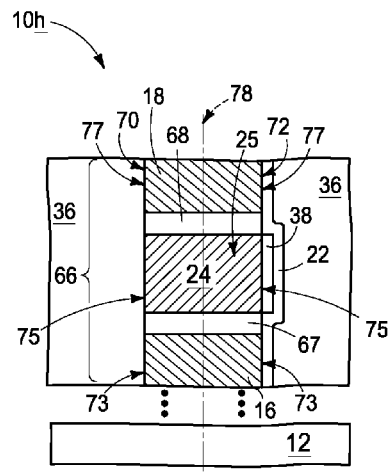

The construction of FIG. 16 has channel material 22 formed along both of the sidewalls 70 and 72; and accordingly has mirror symmetry about a vertical plane 78. In other embodiments, the channel material may be formed along only one of the sidewalls 70/72. For instance, FIG. 17 shows an embodiment in which the channel material 22 and dielectric 38 are formed along sidewall 72 and not sidewall 70. The construction of FIG. 17 does not have mirror symmetry about the vertical plane 78. In some embodiments, the construction of FIG. 17 may be preferred in that it may be scaled to smaller dimensions and/or may be simpler to fabricate than that of FIG. 16. In other embodiments, the symmetric embodiment of FIG. 16 may be preferred in that it has better electrical coupling of the gate and source/drain regions to the channel region and/or is simpler to fabricate.

The transistor constructions exemplified by FIGS. 16-20 may be formed with any suitable processing. Example processing is described with reference to FIGS. 21-29.

Figure 21:
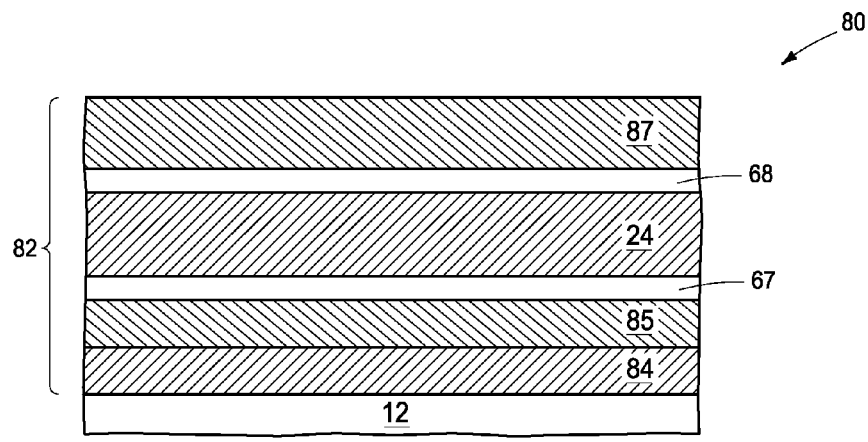
FIGS. 21-29 are diagrammatic sectional views of example embodiment process stages which may be utilized in fabricating integrated circuitry comprising example embodiment transistors.

Referring to FIG. 21, a construction 80 is shown to comprise base 12 and a stack 82 over the base. The stack includes a digit line material 84, source/drain material 85, insulative material 67, conductive gate material 24, insulative material 68 and source/drain material 87. The source/drain materials 85 and 87 may be the same composition as one another or may be different from one another, and are ultimately patterned into source/drain regions 16 and 18, respectively. The source/drain materials may, for example, comprise conductively-doped semiconductor material (for instance, conductively-doped silicon and/or germanium) and/or metal.

Figure 22:
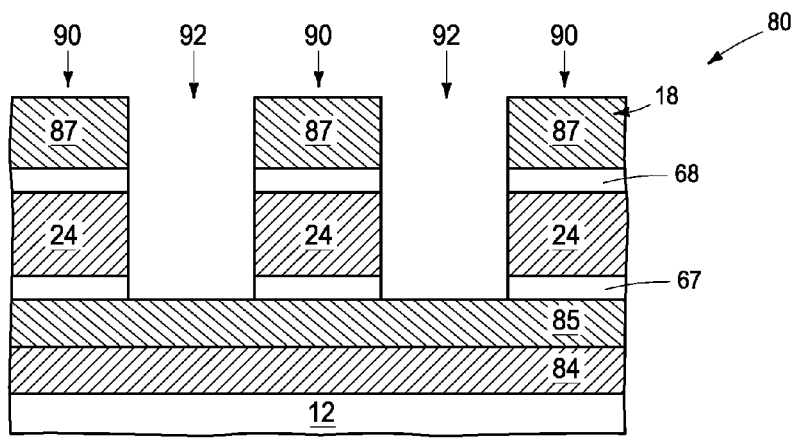

Referring to FIG. 22, the insulative material 67, gate material 24, insulative material 68 and source/drain material 87 are patterned into pillars 90 which are spaced from one another by gaps 92. Such patterning may be accomplished with any suitable processing. For instance, a mask (not shown) may be formed over stack 82 to define locations of the pillars, and subsequently etching may be conducted to form gaps 92. The mask may then be removed to leave the illustrated construction of FIG. 22. The patterning forms material 87 into source/drain regions 18 (at least along the illustrated cross-section of FIG. 22; the source/drain regions may be electrically isolated from one another along a direction orthogonal to the illustrated cross-section (i.e., in and out of the page relative to the illustrated view) with other processing that is not shown).

Figure 23:
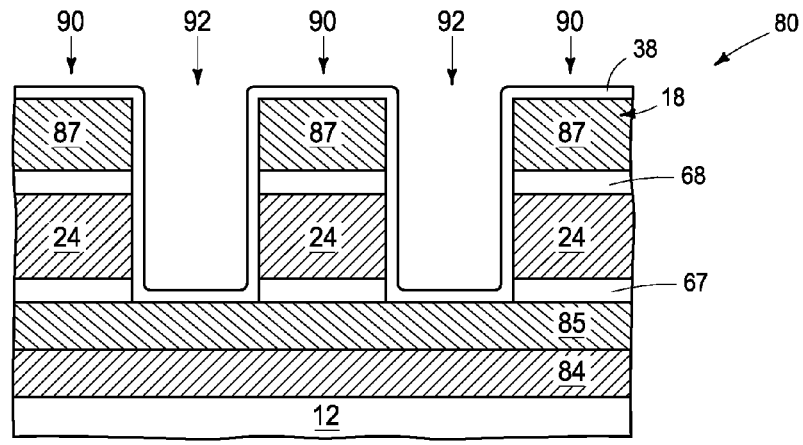

Referring to FIG. 23, gate dielectric 38 is formed to extend over and between the pillars 90.

Figure 24:
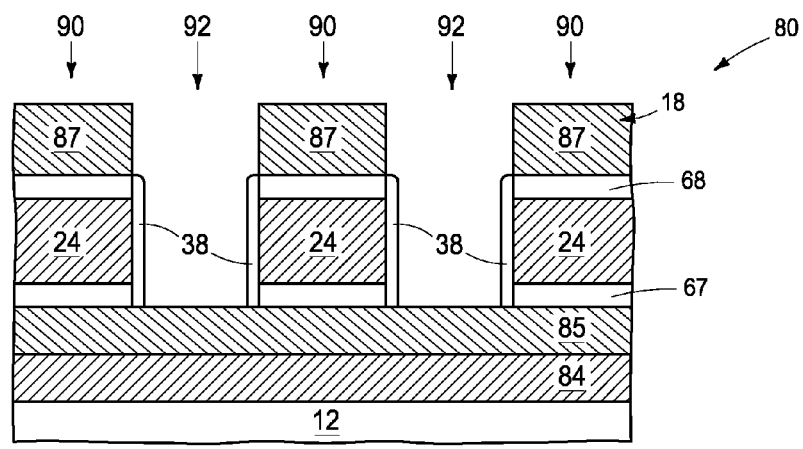

Referring to FIG. 24, the gate dielectric material 38 is anisotropically etched to remove the gate dielectric 38 from along sidewalls of source/drain material 87 while leaving the gate dielectric material along the sidewalls of gate material 24.

Figure 25:
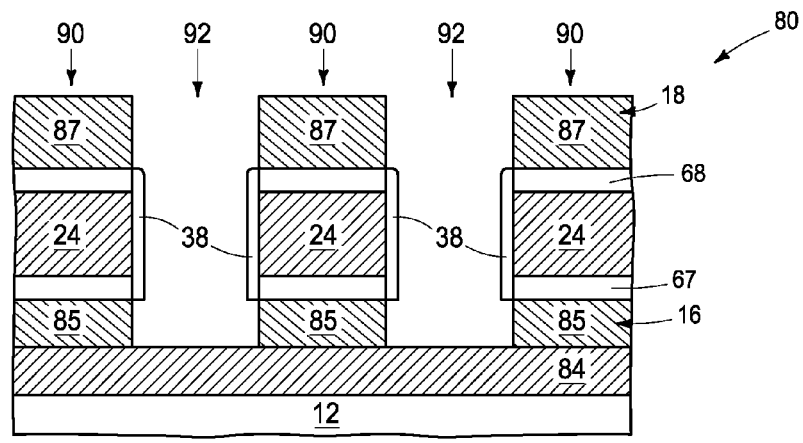

Referring to FIG. 25, the pillars 90 are utilized as a mask during an etch through source/drain material 85. Such patterns the material 85 into pedestals 60 beneath the pillars. The pedestals may have sidewalls approximately vertically coextensive with sidewalls of materials 67, 24, 68 and 87 (as shown), may be inset relative to the other sidewalls (in other embodiments that are not shown), or may extend laterally outwardly of the other sidewalls (in other embodiments that are not shown). The patterning forms material 85 into source/drain regions 16 (at least along the illustrated cross-section of FIG. 25; the source/drain regions may be electrically isolated from one another along a direction orthogonal to the illustrated cross-section (i.e., in and out of the page relative to the illustrated view) with other processing that is not shown).

Figure 26:
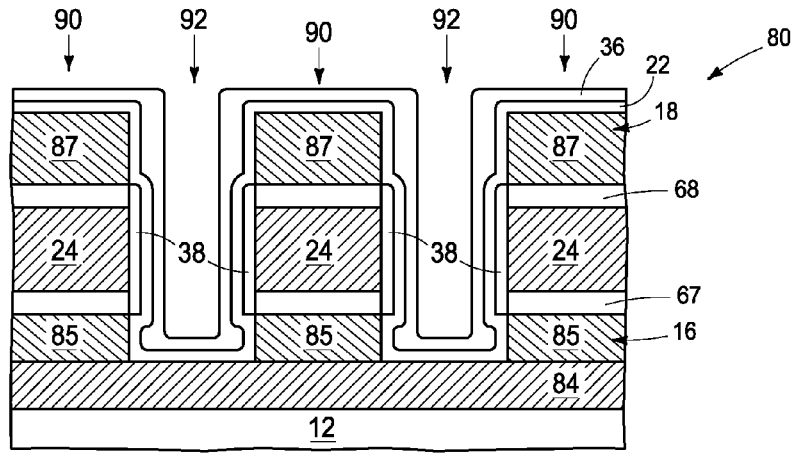

Referring to FIG. 26, channel region material 22 is formed over and between the pillars 90; and insulative material 36 is formed over the channel region material.

Figure 27:
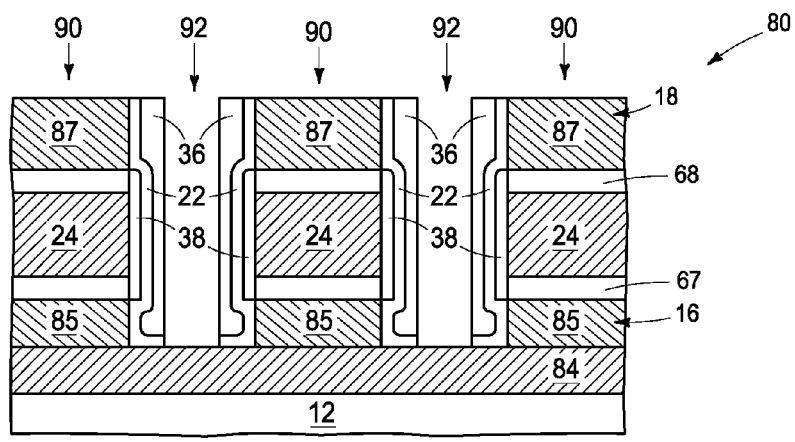

Referring to FIG. 27, materials 22 and 36 are removed from over a top surface of material 87 with suitable processing (for instance, chemical-mechanical polishing or other planarization), and the materials 22 and 36 are removed from over regions of digit line 84 within gaps 92 with suitable processing (for instance, an etch conducted while protecting pillars 90 and regions of materials 22 and 36 along sidewalls of the pillars with a mask). The construction of FIG. 27 has the channel region material 22 formed along sidewalls of pillars 90, and has gaps 92 remaining over regions of the digit line between the pillars. The channel material 22 may also be patterned along a wordline direction (in and out of the page relative to the cross-sectional view of FIG. 27) so that channel material associated with individual transistors is isolated from channel material associated with adjacent transistors along such wordline direction.

Figure 28:
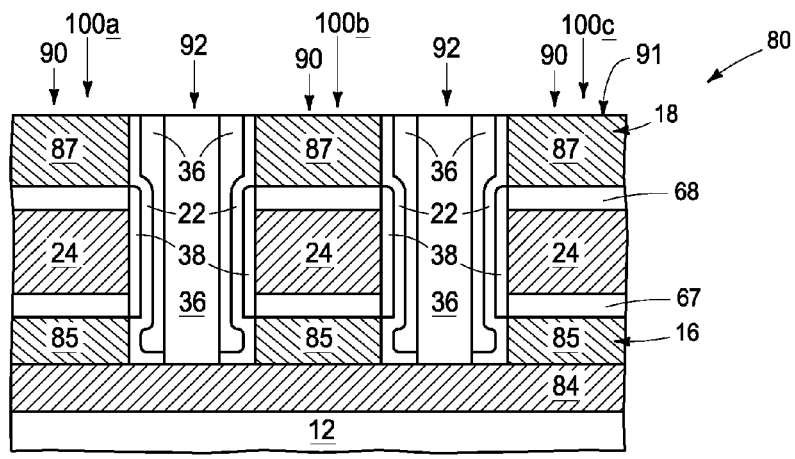

Referring to FIG. 28, additional insulative material 36 is formed within gaps 92 to fill the gaps; and a planarized surface 91 is formed across materials 87, 22 and 36. The additional insulative material 36 may be referred to as third insulative material in some embodiments, to distinguish it from the first and second insulative materials 67 and 68.

In some embodiments, materials 22 and 36 may be formed with processing at or below about 750° C. (with the term "at or below about 750° C." meaning that none of the components of construction 80 are exposed to temperatures exceeding about 750° C. during the deposition of materials 22 and 36). Such processing may be advantageous in that detrimental thermal conditions may be avoided.

The construction of FIG. 28 comprises a plurality of transistors 100a-c. Such transistors may be representative of a large number of transistors formed in an array. The digit line 84 may be representative of a large number of digit lines that extend along columns of the array, and the gate material 24 may be incorporated into wordlines (extending in and out of the page relative to the cross-section of FIG. 28) that extend along rows of the array.

Figure 29:
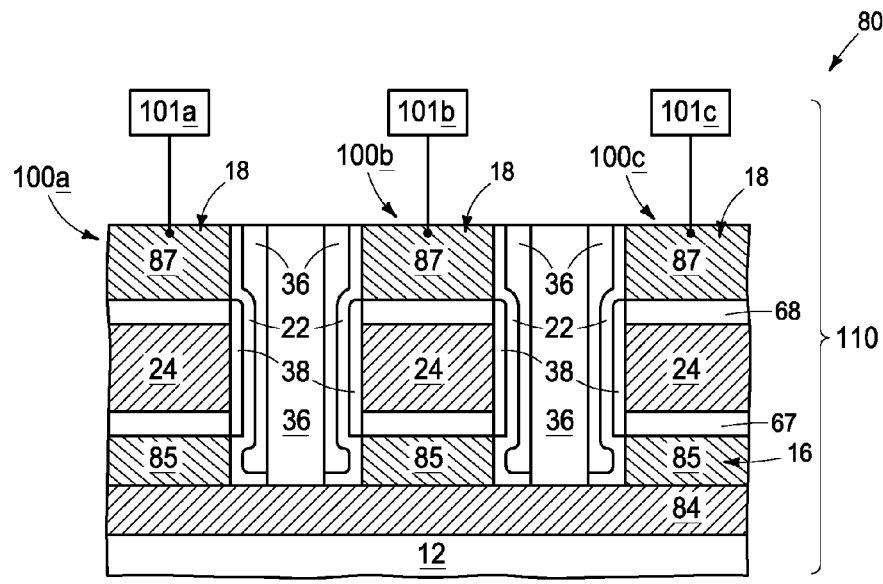

Referring to FIG. 29, the source/drain regions 16 of the transistors are shown connected to circuitry 101a-c. In some embodiments, the transistors are utilized in a memory array and the circuitry 101a-c corresponds to charge-storage devices (for instance capacitors), or to memory cells (for instance, phase change memory cells, conductive bridging RAM cells, other types of RRAM cells, magnetic RAM cells, etc.)

Figure 30:
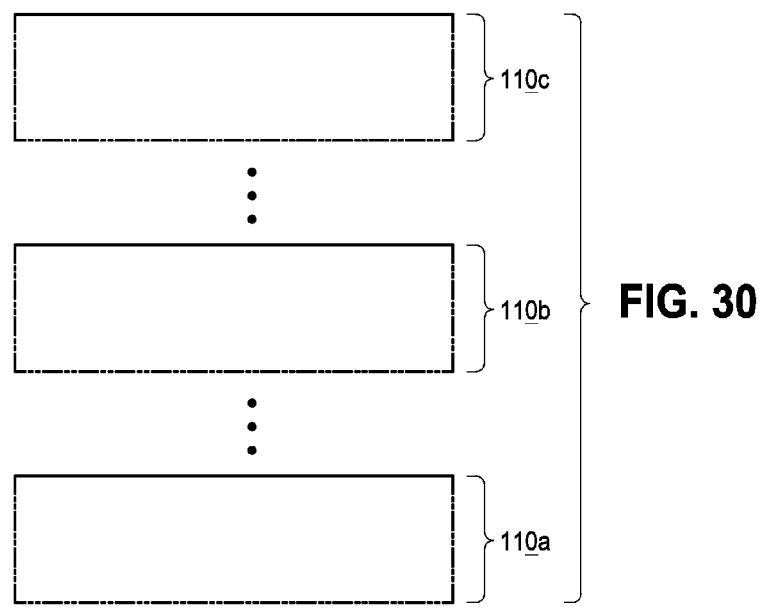
FIG. 30 is a diagrammatic cross-sectional view of an example embodiment stacking arrangement of multiple levels of integrated circuitry.

An advantage of the construction of FIG. 29 is that such may be readily stacked to form three-dimensional architecture. For instance, the construction of FIG. 29 is shown corresponding to a level (or tier) 110 of integrated circuitry. FIG. 30 shows that multiple levels 110a-c may be stacked one atop another in an integrated circuit architecture. The levels are spaced apart from one another to diagrammatically illustrate that there may be other circuitry (including, other levels or tiers) between the levels 110a-c.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

CONCLUSION

In some embodiments, a field effect transistor construction comprises two source/drain regions and a channel region there-between. The channel region comprises a transition metal dichalcogenide material having a thickness of 1 monolayer to 7 monolayers and having a physical length between the source/drain regions. A mid-gate is operatively proximate a mid-portion of the channel region relative to the physical length. A pair of gates is operatively proximate different respective portions of the channel region from the portion of the channel region that the mid-gate is proximate. The pair of gates are spaced and electrically isolated from the mid-gate on opposite sides of the mid-gate. Gate dielectric is between a) the channel region, and b) the mid-gate and the pair of gates.

In some embodiments, a vertical field effect transistor construction comprises an isolating core. A transition metal dichalcogenide material encircles the isolating core and has a lateral wall thickness of 1 monolayer to 7 monolayers. A gate dielectric encircles the transition metal dichalcogenide material. Conductive mid-gate material encircles the gate dielectric at an elevational mid-portion of the transition metal dichalcogenide material. Conductive outer gate material encircles the gate dielectric at an elevational outer portion of the transition metal dichalcogenide material. The outer gate material is elevationally spaced and electrically isolated from the mid-gate material. Conductive inner gate material encircles the gate dielectric at an elevational inner portion of the transition metal dichalcogenide material. The inner gate material is elevationally spaced and electrically isolated from the mid-gate material. An elevationally outer source/drain region encircles the isolating core and is spaced elevationally outward of and electrically isolated from the outer gate material. An elevationally inner source/drain region encircles the isolating core and is spaced elevationally inward of and electrically isolated from the inner gate material.

In some embodiments, a vertical field effect transistor construction comprises conductive mid-gate material. Conductive outer gate material is spaced above and is electrically isolated from the mid-gate material. Conductive inner gate material is spaced below and electrically isolated from the mid-gate material. Gate dielectric is over laterally opposing outer sides of the mid-gate material, the outer gate material, and the inner gate material. A pair of laterally opposing channels is over laterally opposing outer sides of the gate dielectric and is over the laterally opposing outer sides of the mid-gate material, the outer gate material, and the inner gate material. The channels of the pair respectively comprise transition metal dichalcogenide material having a lateral thickness of 1 monolayer to 7 monolayers. An elevationally inner source/drain region is electrically coupled with and is elevationally inward of those portions of the channels that are laterally over the opposing outer sides of the inner gate material. An elevationally outer source/drain region is electrically coupled with and is elevationally outward of those portions of the channels that are laterally over the opposing outer sides of the outer gate material.

In some embodiments, a memory array comprises a plurality memory cells that individually comprise a vertical field effect transistor. The transistor comprises an elevationally outer source/drain region, an elevationally inner source/drain region, and a channel region elevationally between the outer and inner source/drain regions. The channel region comprises a transition metal dichalcogenide material having a lateral thickness of 1 monolayer to 7 monolayers and having a physical length elevationally between the source/drain regions. A mid-gate is laterally proximate an elevational mid-portion of the channel region. An outer gate is above the mid-gate laterally proximate an elevational outer portion of the channel region. The outer gate is elevationally spaced and electrically isolated from the mid-gate. An inner gate is below the mid-gate laterally proximate an elevational inner portion of the channel region. The inner gate is elevationally spaced and electrically isolated from the mid-gate. Gate dielectric is laterally between a) the channel region, and b) the mid-gate, the outer gate, and the inner gate. At least one of a) the outer gates are electrically coupled to one another within the array, and b) the inner gates are electrically coupled to one another within the array.

In some embodiments, a vertical field effect transistor construction includes a vertically-oriented stack comprising, in ascending order, a bottom source/drain region, a first insulative material, a conductive gate, a second insulative material, and a top source/drain region. The stack has a vertical sidewall. The vertical sidewall has a bottom portion along the bottom source/drain region, a middle portion along the conductive gate, and a top portion along the top source/drain region. Third insulative material is along an entirely of the middle portion of the vertical sidewall. A channel region material is along the third insulative material and is spaced from the conductive gate by the third insulative material. The channel region material is directly against at least part of the bottom portion of the vertical sidewall, and is directly against at least part of the top portion of the vertical sidewall. The channel region material has a thickness within a range of from greater than about 3 Å to less than or equal to about 10 Å.

In some embodiments, a vertical field effect transistor construction comprises a bottom source/drain region, a conductive gate directly above the bottom source/drain region, and a top source/drain region directly above the conductive gate. Insulative material is along a sidewall of the conductive gate. Channel region material is along the insulative material and spaced from the conductive gate by the insulative material. The channel region material extends at least partially along a sidewall of the bottom source/drain region and at least partially along a sidewall of the top source/drain region. The channel region material has a thickness of from 1 monolayer to 7 monolayers.

In some embodiments, a method of forming transistors comprises forming a stack comprising, an ascending order, digit line material, first source/drain region material, first insulative material, gate material, second insulative material and second source/drain material. The first insulative material, gate material, second insulative material and second source/drain material are patterned into pillars. Gate dielectric material is formed along sidewalls of the pillars. The gate dielectric material is along the gate material and not along the second source/drain material. The pillars are utilized as a mask during an etch through the drain region material. The etch forms the drain region material into pedestals beneath the pillars. Channel region material is formed along sidewalls of the pillars and pedestals. Gaps are left over regions of the digit line material between the pillars and pedestals. The channel region material has a thickness of from 1 monolayer to 7 monolayers. The gaps are filled with third insulative material. A top surface across the second source/drain material, channel region material and third insulative material is planarized.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:
1. A vertical field effect transistor construction comprising:
   a vertically-oriented stack comprising, in ascending order, a bottom source/drain region, a first insulative material, a conductive gate, a second insulative material, and a top source/drain region; the stack having a vertical sidewall;

the vertical sidewall having a bottom portion along the bottom source/drain region, a middle portion along the conductive gate, and a top portion along the top source/drain region;

third insulative material along an entirely of the middle portion of the vertical sidewall;

a channel region material along the third insulative material and spaced from the conductive gate by the third insulative material; the channel region material being directly against at least part of the bottom portion of the vertical sidewall, and being directly against at least part of the top portion of the vertical sidewall; and the channel region material having a thickness within a range of from greater than about 3 Å to less than or equal to about 10 Å.

2. The construction of claim 1 wherein the channel region material comprises crystalline semiconductor material.

3. The construction of claim 1 wherein the channel region material comprises transition metal chalcogenide.

4. The construction of claim 1 wherein the channel region material comprises transition metal dichalcogenide and/or transition metal trichalcogenide.

5. The construction of claim 1 wherein the channel region material comprises one or more chalcogenides selected from the group consisting of molybdenum sulfide, molybdenum selenide, tungsten sulfide, tungsten selenide, indium sulfide and indium selenide.

6. The construction of claim 1 wherein the vertical sidewall is a first vertical sidewall, and the stack has a second vertical sidewall in opposing relation to the first vertical sidewall; and wherein the construction has mirror symmetry along a vertical plane through a center of the stack such that the channel region material and third insulative material are also along the second vertical sidewall.

7. The construction of claim 1 wherein the vertical sidewall is a first vertical sidewall, and the stack has a second vertical sidewall in opposing relation to the first vertical sidewall; and wherein the construction does not have mirror symmetry along a vertical plane through a center of the stack.

8. The construction of claim 1 wherein the channel region material extends only partially along one or both of the top and bottom portions of the vertical sidewall.

9. The construction of claim 1 wherein the channel region material extends entirely along at least one of the top and bottom portions of the vertical sidewall.

10. The construction of claim 1 wherein the channel region material extends entirely along both of the top and bottom portions of the vertical sidewall.

11. The construction of claim 1 wherein the third insulative material extends along the first insulative material.

12. The construction of claim 1 wherein the third insulative material extends along the second insulative material.

13. A vertical field effect transistor construction comprising:

a bottom source/drain region;
a conductive gate directly above the bottom source/drain region;
a top source/drain region directly above the conductive gate;
insulative material along a sidewall of the conductive gate;
channel region material along the insulative material and spaced from the conductive gate by the insulative material; the channel region material extending at least partially along a sidewall of the bottom source/drain region and at least partially along a sidewall of the top source/drain region; and the channel region material having a thickness of from 1 monolayer to 7 monolayers.

14. The construction of claim 13 wherein the channel region material comprises transition metal chalcogenide.

15. The construction of claim 13 wherein the channel region material comprises transition metal dichalcogenide and/or transition metal trichalcogenide.

16. The construction of claim 13 wherein the channel region material comprises one or more chalcogenides selected from the group consisting of molybdenum sulfide, molybdenum selenide, tungsten sulfide, tungsten selenide, indium sulfide and indium selenide.

17. The construction of claim 13 having mirror symmetry along a vertical plane such that the channel region material and insulative material are along two opposing sides of the construction.

18. The construction of claim 13 not having mirror symmetry along a vertical plane.

19. The construction of claim 13 wherein the channel region material extends entirely along the sidewall of the bottom source/drain region.

20. The construction of claim 13 wherein the channel region material extends entirely along the sidewall of the top source/drain region.

21. The construction of claim 13 wherein the channel region material extends entirely along the sidewalls of the top and bottom source/drain regions.

22. A method of forming transistors, comprising:

forming a stack comprising, an ascending order, digit line material, first source/drain region material, first insulative material, gate material, second insulative material and second source/drain material;
patterning the first insulative material, gate material, second insulative material and second source/drain material into pillars;
forming gate dielectric material along sidewalls of the pillars, the gate dielectric material being along the gate material and not along the second source/drain material;
utilizing the pillars as a mask during an etch through the drain region material;
the etch forming the drain region material into pedestals beneath the pillars;
forming channel region material along sidewalls of the pillars and pedestals, and leaving gaps over regions of the digit line material between the pillars and pedestals, the channel region material having a thickness of from 1 monolayer to 7 monolayers; and
filling the gaps with third insulative material and planarizing a top surface across the second source/drain material, channel region material and third insulative material.

23. The method of claim 22 wherein gate material within the pillars extends along a wordline direction, and further comprising patterning the channel material along the wordline direction.

24. The method of claim 22 wherein the channel region material comprises transition metal chalcogenide.

25. The method of claim 22 wherein the channel region material comprises transition metal dichalcogenide and/or transition metal trichalcogenide.

26. The method of claim 22 wherein the channel region material comprises one or more chalcogenides selected from the group consisting of molybdenum sulfide, molybdenum selenide, tungsten sulfide, tungsten selenide, indium sulfide and indium selenide.

27. The method of claim 22 wherein the channel region material is deposited at a temperature of less than or equal to about 750° C.

28. The method of claim 22 wherein the top source/drain material is patterned into top source/drain regions during the patterning into the pillars, and further comprising forming memory cells electrically coupled to the top source/drain regions.

29. The method of claim 22 wherein the top source/drain material is patterned into top source/drain regions during the patterning into the pillars, and further comprising forming charge storage devices electrically coupled to the top source/drain regions.

30. A field effect transistor construction comprising:
two source/drain regions and a channel region there-between, the channel region comprising a transition metal chalcogenide material having a thickness of 1 monolayer to 7 monolayers and having a physical length between the source/drain regions;
a mid-gate operatively proximate a mid-portion of the channel region relative to the physical length;
a pair of gates operatively proximate different respective portions of the channel region from the portion of the channel region that the mid-gate is proximate, the pair of gates being spaced and electrically isolated from the mid-gate on opposite sides of the mid-gate; and
gate dielectric between a) the channel region, and b) the mid-gate and the pair of gates.

31. A vertical field effect transistor construction comprising:
an isolating core;
a transition metal chalcogenide material encircling the isolating core and having a lateral wall thickness of 1 monolayer to 7 monolayers;
a gate dielectric encircling the transition metal chalcogenide material;
conductive mid-gate material encircling the gate dielectric at an elevational mid-portion of the transition metal chalcogenide material;
conductive outer gate material encircling the gate dielectric at an elevational outer portion of the transition metal chalcogenide material, the outer gate material being elevationally spaced and electrically isolated from the mid-gate material;
conductive inner gate material encircling the gate dielectric at an elevational inner portion of the transition metal chalcogenide material, the inner gate material being elevationally spaced and electrically isolated from the mid-gate material;
an elevationally outer source/drain region encircling the isolating core and spaced elevationally outward of and electrically isolated from the outer gate material; and
an elevationally inner source/drain region encircling the isolating core and spaced elevationally inward of and electrically isolated from the inner gate material.

32. A vertical field effect transistor construction comprising:
conductive mid-gate material;
conductive outer gate material spaced above and electrically isolated from the mid-gate material;
conductive inner gate material spaced below and electrically isolated from the mid-gate material;
gate dielectric over laterally opposing outer sides of the mid-gate material, the outer gate material, and the inner gate material;
a pair of laterally opposing channels over laterally opposing outer sides of the gate dielectric and over the laterally opposing outer sides of the mid-gate material, the outer gate material, and the inner gate material; the channels of the pair respectively comprising transition metal chalcogenide material having a lateral thickness of 1 monolayer to 7 monolayers;
an elevationally inner source/drain region electrically coupled with and elevationally inward of those portions of the channels that are laterally over the opposing outer sides of the inner gate material; and
an elevationally outer source/drain region electrically coupled with and elevationally outward of those portions of the channels that are laterally over the opposing outer sides of the outer gate material.

33. A memory array, comprising:
a plurality memory cells individually comprising a vertical field effect transistor, the transistor comprising:
an elevationally outer source/drain region, an elevationally inner source/drain region, and a channel region elevationally between the outer and inner source/drain regions, the channel region comprising a transition metal chalcogenide material having a lateral thickness of 1 monolayer to 7 monolayers and having a physical length elevationally between the source/drain regions;
a mid-gate laterally proximate an elevational mid-portion of the channel region;
an outer gate above the mid-gate laterally proximate an elevational outer portion of the channel region, the outer gate being elevationally spaced and electrically isolated from the mid-gate;
an inner gate below the mid-gate laterally proximate an elevational inner portion of the channel region, the inner gate being elevationally spaced and electrically isolated from the mid-gate; and
gate dielectric laterally between a) the channel region, and b) the mid-gate, the outer gate, and the inner gate;
at least one of a) the outer gates being electrically coupled to one another within the array, and b) the inner gates being electrically coupled to one another within the array.

* * * * *